US010825508B1

(12) United States Patent
Tseng et al.

(10) Patent No.: US 10,825,508 B1
(45) Date of Patent: Nov. 3, 2020

(54) BIT LINE STRUCTURE FOR TWO-TRANSISTOR STATIC RANDOM ACCESS MEMORY

(71) Applicant: Powerchip Semiconductor Manufacturing Corporation, Hsinchu (TW)

(72) Inventors: Pei-Hsiu Tseng, Taoyuan (TW); I-Shuan Wei, Taoyuan (TW); Jia-You Lin, Hsinchu (TW); Shou-Zen Chang, Hsinchu (TW); Chi-Wei Lin, New Taipei (TW); Hung-Hsun Lin, New Taipei (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/712,878

(22) Filed: Dec. 12, 2019

(30) Foreign Application Priority Data

Oct. 2, 2019 (TW) .............................. 108135613 A

(51) Int. Cl.
*G11C 11/4097* (2006.01)
*H01L 27/11* (2006.01)
*G11C 11/404* (2006.01)
*H01L 27/108* (2006.01)

(52) U.S. Cl.
CPC ...... *G11C 11/4097* (2013.01); *G11C 11/4045* (2013.01); *H01L 27/108* (2013.01); *H01L 27/1104* (2013.01)

(58) Field of Classification Search
CPC ............. G11C 11/4045; G11C 11/4097; H01L 27/108; H01L 27/1104
USPC .................................................. 365/149, 154
See application file for complete search history.

(56) References Cited

U.S. PATENT DOCUMENTS

| 7,799,675 | B2 * | 9/2010 | Lee ........................ H01L 24/83 |
| | | | 438/637 |
| 7,889,541 | B2 * | 2/2011 | Shih ...................... G11C 11/412 |
| | | | 365/154 |
| 8,368,137 | B2 | 2/2013 | Mokhlesi |
| 9,123,714 | B2 | 9/2015 | Pachamuthu |
| 9,899,389 | B2 * | 2/2018 | Luan ...................... G11C 11/39 |
| 10,020,311 | B1 * | 7/2018 | Li ...................... H01L 27/10817 |
| 2006/0284246 | A1 | 12/2006 | Forbes |

FOREIGN PATENT DOCUMENTS

| TW | 200403871 | 3/2004 |
| TW | 201334159 A1 | 8/2013 |

* cited by examiner

*Primary Examiner* — Son L Mai
(74) *Attorney, Agent, or Firm* — Winston Hsu

(57) ABSTRACT

A bit line structure for two-transistor static random access memory (2T SRAM), including multiple bit lines extending over multiple 2T SRAMs in a first direction, wherein each bit line consists of multiple first portions and second portions extending in the first direction and electrically connecting with each other in an alternating manner, and the first portions and the second portions are in a first dielectric layer and a second dielectric layer respectively, and the first portions of each bit line correspond to the second portions of adjacent bit lines.

8 Claims, 4 Drawing Sheets

BIT LINE STRUCTURE FOR TWO-TRANSISTOR STATIC RANDOM ACCESS MEMORY

BACKGROUND OF THE INVENTION

1. Field of the Invention

The present invention relates generally to a bit line structure in integrated circuit, and more specifically, to a bit line structure in alternating two layers design.

2. Description of the Prior Art

Recent developments in multimedia applications such as, cell phones and USB disk, etc. have increasingly required memory devices with higher density. Conventional memories include dynamic random access memory (DRAM), static random access memory (SRAM), and non-volatile memory (NVM). Non-volatile memory may include read only memory (ROM), electrically erasable programmable read only memory (EEPROM), and flash memory.

In conventional capacitor under bit-line (CUB) memory structure, bit lines are fabricated at the same metal level (e.g. M2) on capacitor cells with minimum line and spacing design rules, so that there is coupling capacitance within each bit-line pair (BL and BL-bar) as well as from adjacent bit-lines. The bit-line to bit-line coupling noise is one of the most critical issues in SRAM cell design. The signal charge stored in the cell capacitor must be large enough to make the signals under worst coupling conditions sensed by the sense amplifier. If the bit-line coupling noise can be eliminated totally, then the charge that needs to be stored in the cell capacitor may be decreased significantly.

Currently, there are several approaches for reducing the bit-line coupling noise, for example, by inserting other circuit structure between bit lines or using twisted bit lines design, on the principle to increase the spacing between bit lines and reduce the coupling noise. However, these approaches would significantly increase required cell area, circuit complexity and manufacturing costs. Accordingly, industry insiders still need to develop new approach for solving the bit line noise issue.

SUMMARY OF THE INVENTION

In order to solve conventional coupling noise issue that is prone to occur between bit lines in semiconductor field, the present invention hereby provides a particular bit line structure, with alternating two layers design to significantly increase the spacing between bit lines, especially suitable to two-transistor static random access memory (2T SRAM).

One aspect of present invention is to provide a bit line structure for two-transistor static random access memory (2T SRAM), including multiple bit lines in parallel and extending over metal-insulator-metal capacitors, n-type transistors and p-type transistors of multiple 2T SRAMs in a first direction, wherein each bit line is made of multiple first portions and second portions extending in the first direction and electrically connecting with each other in an alternating manner, and the first portions and the second portions are in a first dielectric layer and a second dielectric layer respectively, and the first portions of each bit line correspond to the second portions of adjacent bit lines.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
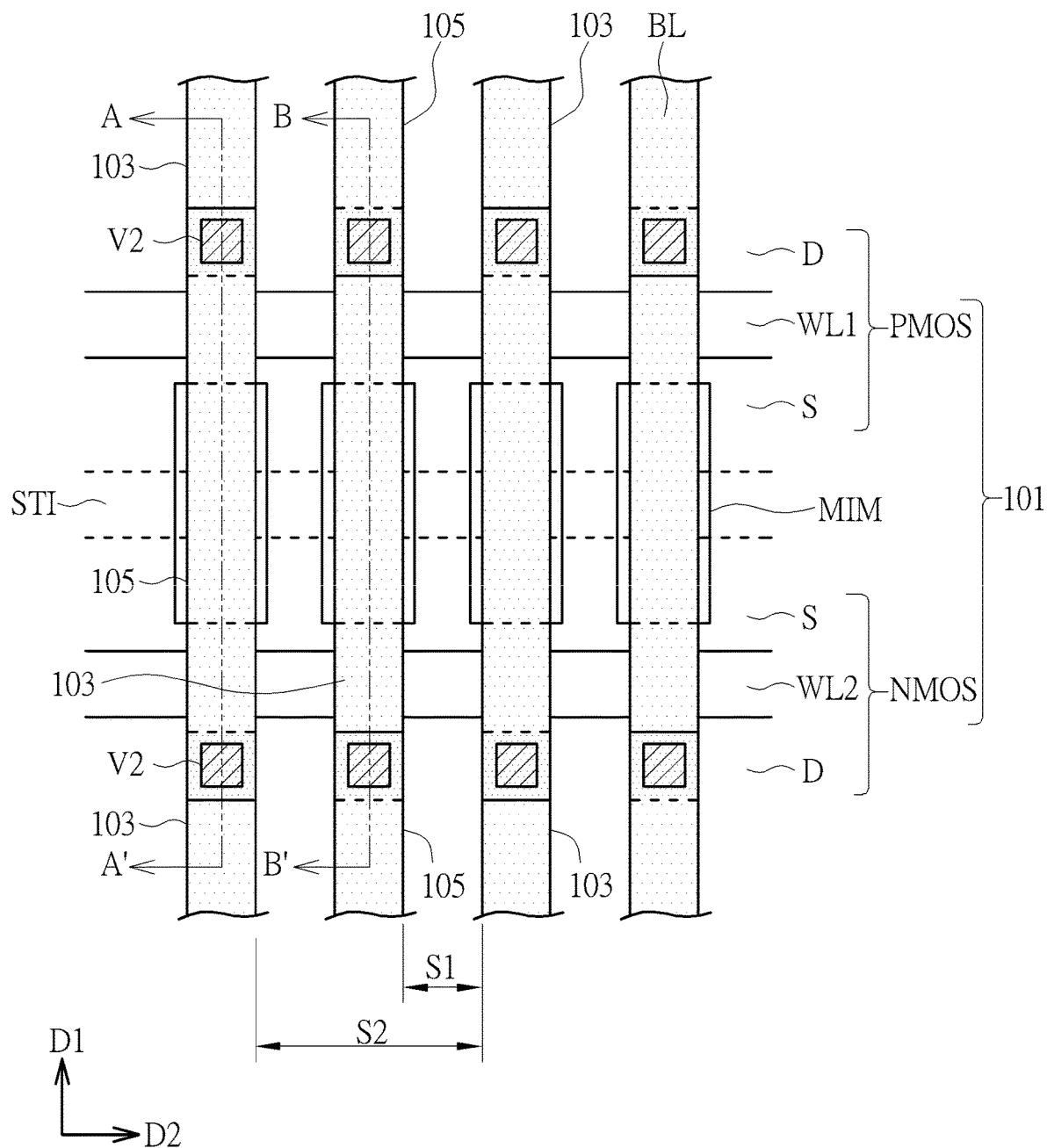
FIG. 1 is a schematic top view of a bit line structure in accordance with the preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

Figure 2:
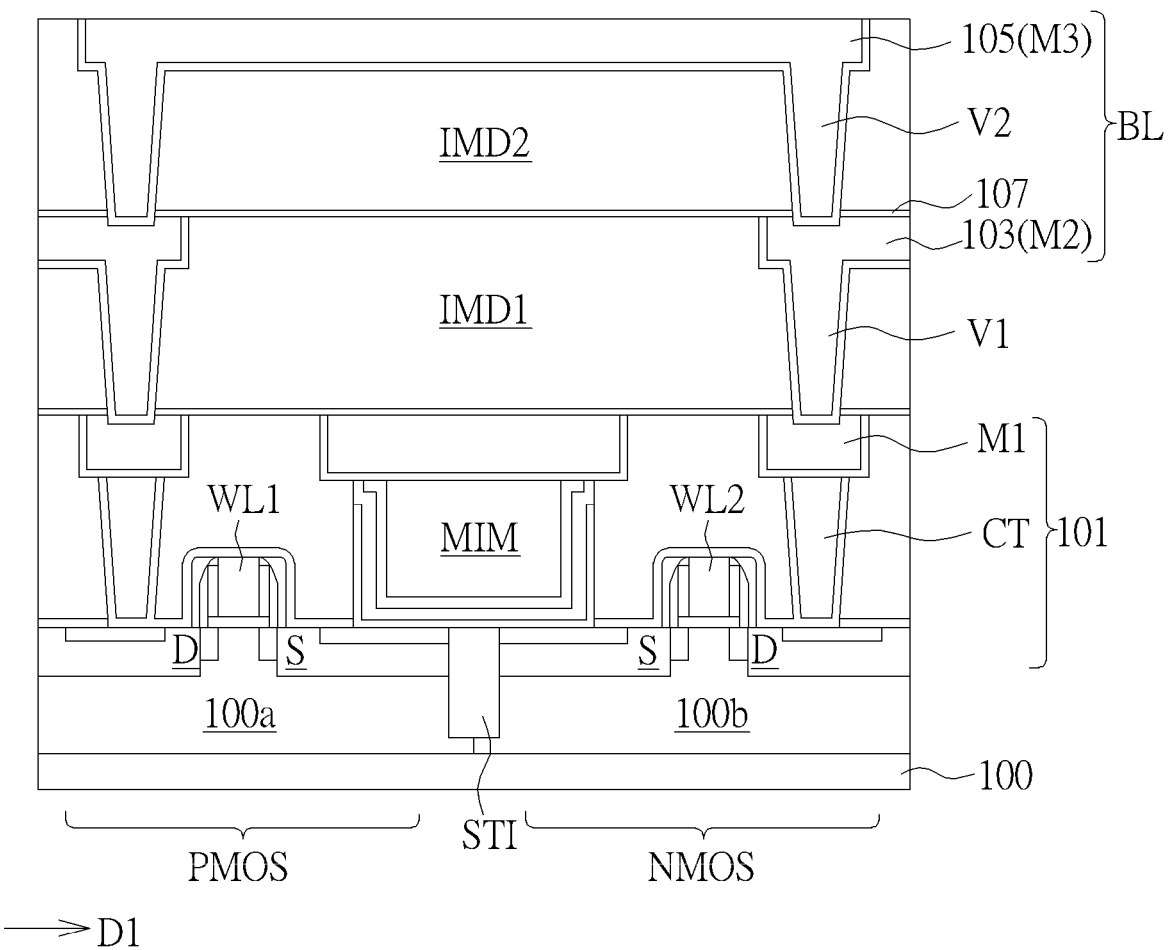
FIG. 2 is a schematic cross-sectional view taken along the section line A-A' in FIG. 1 in accordance with the preferred embodiment of the present invention.

Please refer to FIG. 1 and FIG. 2 together, which illustrates schematic top view and cross-sectional view of a bit line structure respectively in accordance with the preferred embodiment of the present invention. The feature of present invention is illustrated with reference to these two figures to make person having ordinary skill in the art to have a better understanding of arrangement and connection relation of components of the present invention in horizontal aspect and vertical aspect. Please note that FIG. 2 is a schematic cross-section taken along the section line A-A' in FIG. 1. While adjacent bit line structures may have different cross-section, they will be illustrated later with reference to FIG. 3 that is taken along the section line B-B' in FIG. 1.

In the embodiment of present invention, bit lines BL are arranged over two-transistor static random access memories (2T SRAMs) in capacitor under bit-line (CUB) architecture. Multiple bit lines BL are spaced apart and extend in a first direction D1 over multiple 2T SRAMs 101, including components of metal-insulator-metal capacitors MIM, n-type transistors NMOS, p-type transistors PMOS, etc. The feature of bit lines BL in the present invention is that each bit line consists of multiple first portions 103 and second portions 105 extending in the first direction D1 and electrically connecting with each other in an alternating manner. Two ends of each first portion 103 are respectively and electrically connected to one end of two second portions 105.

More specifically, in the present invention, the first portions 103 and the second portions 105 of bit line BL are formed respectively in a lower layer and an upper layer, rather than the whole bit line is formed in the same layer like the one in prior art. For Example, in the embodiment shown in FIG. 2, the first portion 103 of bit line BL is a part of second metal layer (M2) formed in an inter-metal dielectric IMD1, while the second portion 105 of bit line BL is a part of third metal layer (M3) formed in an inter-metal dielectric IMD2 above the inter-metal dielectric IMD1. An etch stop layer 107 is formed between the inter-metal dielectric IMD1 and the inter-metal dielectric IMD2. The first portions 103 and the second portions 105 of bit line BL are electrically connected through interconnections such as vias V2.

Figure 4:
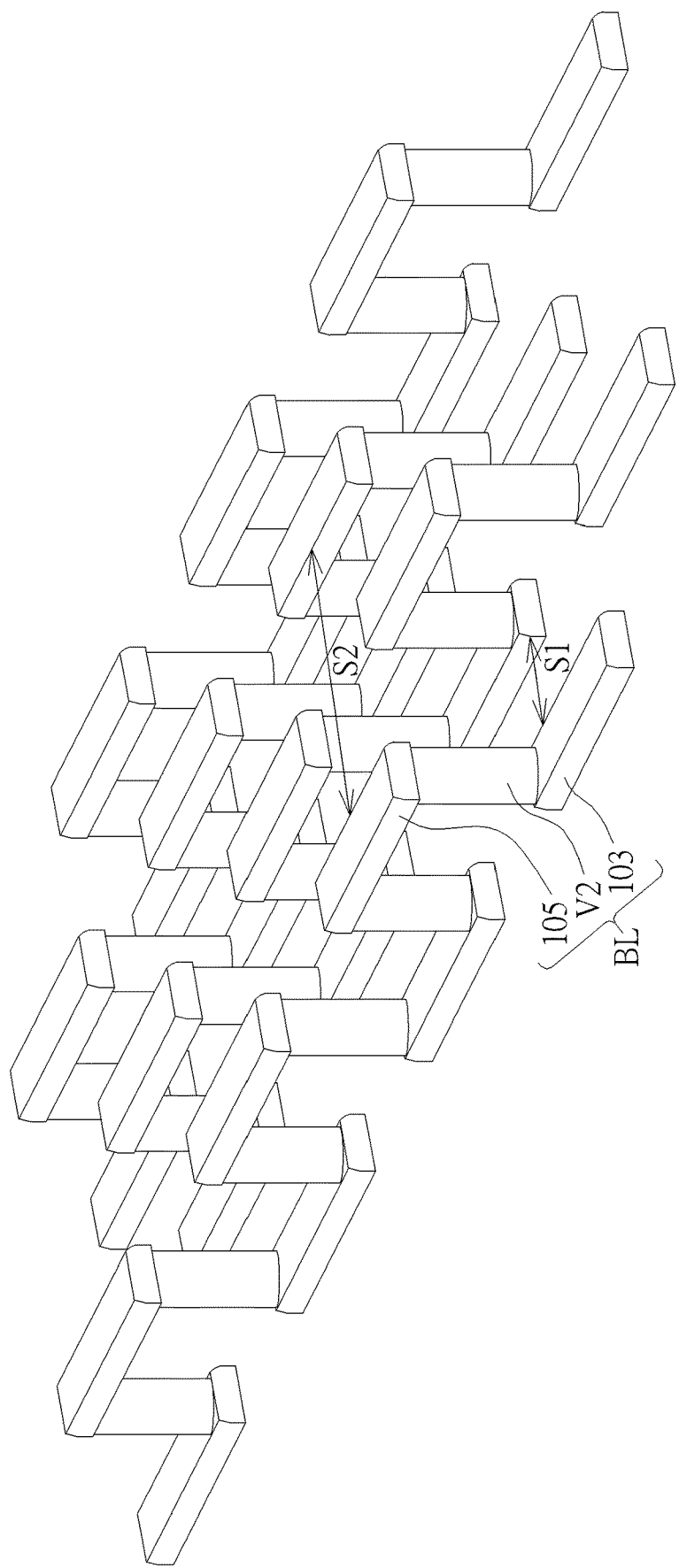
FIG. 4 is a schematic perspective view of the bit line structure in accordance with the preferred embodiment of the present invention.

Furthermore, as shown in FIG. 1, the first portions 103 of each bit line BL would correspond to the second portions 105 of adjacent bit lines BL at two sides. Similarly, the second portions 105 of each bit line BL would correspond to the first portions 103 of adjacent bit lines BL at two sides. FIG. 4 clearly shows the design of bit line structure in this two-layer and alternating arrangement. In this architecture, the distance between adjacent bit lines BL in horizontal plane, i.e. the distance between a first portion 103 of a bit line BL and a first portion 103 of another adjacent bit line BL, is changed from original spacing S1 to spacing S2. In real implementation, the spacing S2 may be several times the length of the original spacing S1, so that the capacitor between bit lines may be reduced nearly by half, and bit line noise may be effectively inhibited. The aforementioned approach of present invention is different from conventional approaches like inserting other circuit structure between bit lines or using twisted bit lines. The spacing between adjacent bit lines may be significantly increased to achieve the reduction of bit line noise, without increasing original cell layout area.

Refer again to FIG. 1 and FIG. 2. In the present invention, bit line BL corresponds to underlying 2T SRAM 101. In the embodiment shown in FIG. 2, the second portion 105 of bit line BL would extend over one underlying 2T SRAM 101 in the first direction D1, including its components of metal-insulator-metal capacitor MIM, n-type transistor NMOS, p-type transistor PMOS, etc. The 2T SRAM 101 is formed on a substrate 100, wherein the substrate 100 may be provided with a n-type deep well and a n-type well 100a and p-type well 100b defined therein. P-type transistor PMOS is formed on the n-type well 100a of substrate 100, and n-type transistor NMOS is formed on the p-type well 100b of substrate 100, with a shallow trench isolation STI isolating therebetween. The shallow trench isolation STI is right under the middle of the second portion 105 of bit line BL and extends through multiple bit lines BL in a second direction D2 perpendicular to the first direction D1. The metal-insulator-metal capacitor MIM of 2T SRAM 101 is arranged on the shallow trench isolation STI, with its bottom electrode connecting respectively with the source of n-type transistor NMOS and the source of p-type transistor PMOS at two sides. The gates of n-type transistor NMOS and p-type transistor PMOS are word line WL1 and word line WL2 respectively controlling the channel switch between source S and drain D of the 2T SRAM 101, wherein the word line WL1 and word line WL2 extend through multiple bit lines BL in the second direction D2 perpendicular to the first direction D1 and are arranged between the metal-insulator-metal capacitor MIM and two contacts CT respectively.

Refer to FIG. 2 again. Drains D of n-type transistor NMOS and p-type transistor PMOS are electrically connected to first metal layer M1 through contacts CT, and further electrically and connected to two adjacent first portions 103 of the same bit line BL above respectively through vias V1. In the embodiment of present invention, contact CT, via V1 and via V2 that connects with the first portion 103 and the second portion 105 of bit line BL may overlap each other. The top electrode of metal-insulator-metal MIM of 2T SRAM 101 may be connected with the first metal layer M1 above. The first metal layer M1 extends under said second portions 105 of bit lines in the second direction D2 perpendicular to the first direction D1 and overlaps the centerline of the second portions 105.

Figure 3:
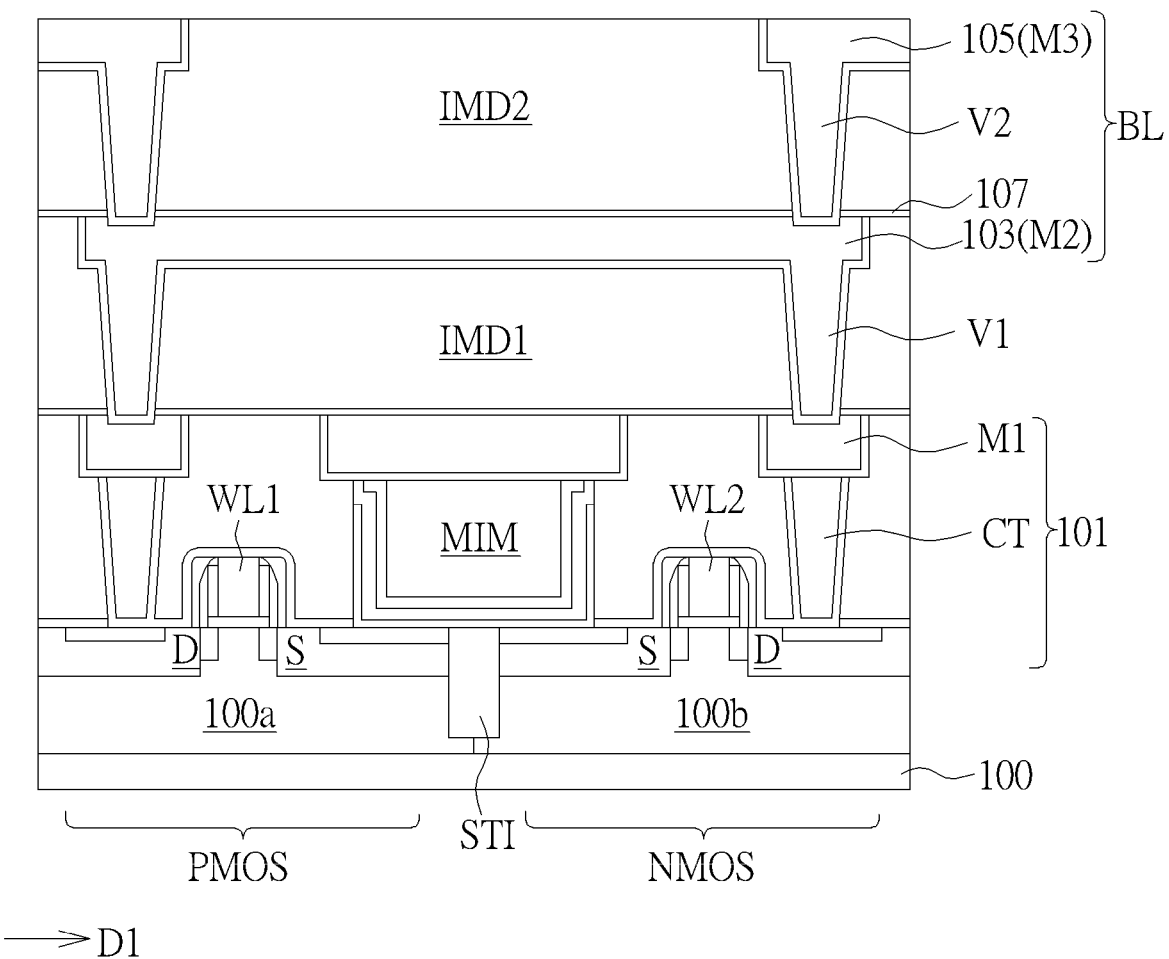
FIG. 3 is a schematic cross-sectional view taken along the section line B-B' in FIG. 1 in accordance with the preferred embodiment of the present invention.

Next, please refer to FIG. 3, which illustrates a schematic cross-sectional view taken along the section line B-B' in FIG. 1 in accordance with the preferred embodiment of the present invention. In the embodiment of present invention, unlike the bit line shown in FIG. 2, since each first portion 103 of bit line corresponds to the second portions 105 of bit lines BL at two sides, it is first portion 103 of bit line BL in inter-metal dielectric IMD1 would extend over 2T SRAM 101 in the first direction D1. Therefore, drains of n-type transistor NMOS and p-type transistor PMOS are electrically and respectively connected to the same first portion 103 of the same bit line BL above sequentially through contacts CT, first metal layer M1 and vias V1. In addition, the first metal layer M1 that connects with top electrode of metal-insulator-metal capacitor MIM of the 2T SRAM 101 would extend through the first portions 103 of bit lines BL and overlap the centerline of the first portions 103, while the arrangement of other portions remains unchanged.

Please note that the arrangement of aforementioned first portion 103, second portion 105 for bit line BL and 2T SRAM 101 is provided as a preferred embodiment of the present invention, various modifications of the disclosed embodiments may be embodied in real implementation. For example, the first portions 103 and the second portions 105 of bit line BL may be formed neither in the second metal layer M2 nor in the third metal layer M3. Each first portion 103 and each second portion 105 of bit line BL may extend over the area of one 2T SRAM 101. The overlapping portion of first portion 103 and second portion 105 of bit line BL may not locate right above the contact CT. Alternatively, each 2T SRAM 101 may correspond to more than one bit line BL.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bit line structure for two-transistor static random access memory (2T SRAM), comprising multiple bit lines in parallel and extending over metal-insulator-metal capacitors, n-type transistors and p-type transistors of multiple 2T SRAMs in a first direction;
   wherein each bit line is made of multiple first portions and second portions extending in said first direction and electrically connecting with each other in an alternating manner, and said first portions and said second portions are in a first dielectric layer and a second dielectric layer respectively, and said first portions of each bit line correspond to said second portions of adjacent said bit lines.

2. The bit line structure for two-transistor static random access memory (2T SRAM) of claim 1, wherein said first portions and said second portions of said bit line are electrically connected through vias in said second dielectric layer.

3. The bit line structure for two-transistor static random access memory (2T SRAM) of claim 1, wherein said first portion is second metal layer, said second portion is third metal layer, and top electrodes of said metal-insulator-metal capacitors connect to a first metal layer.

4. The bit line structure for two-transistor static random access memory (2T SRAM) of claim 3, wherein said first metal layer connecting said top electrodes of said 2T SRAMs extends under said first portions or said second portions of said bit lines in a second direction perpendicular to said first direction and overlaps a centerline of said first portions or said second portions.

5. The bit line structure for two-transistor static random access memory (2T SRAM) of claim 1, wherein a drain of said n-type transistor and a drain of said p-type transistor of said 2T SRAM are electrically connected to said bit line through contacts, and a source of said n-type transistor and a source of said p-type transistor are electrically connected with bottom electrodes of said metal-insulator-metal capacitors.

6. The bit line structure for two-transistor static random access memory (2T SRAM) of claim 5, wherein a gate of said n-type transistor and a gate of said p-type transistor are a first word line and a second word line respectively and extend respectively between said metal-insulator-metal capacitor of said 2T SRAM and said contacts in a second direction perpendicular to said first direction.

7. The bit line structure for two-transistor static random access memory (2T SRAM) of claim 5, a drain of said n-type transistor and a drain of said p-type transistor of said 2T SRAM are electrically connected to adjacent two said first portions of said bit line through said contacts.

8. The bit line structure for two-transistor static random access memory (2T SRAM) of claim 5, wherein a drain of said n-type transistor and a drain of said p-type transistor of said 2T SRAM are electrically connected to one said first portion of said bit line through said contacts.

* * * * *